(12) United States Patent
Patra et al.

(10) Patent No.: US 11,411,370 B2
(45) Date of Patent: Aug. 9, 2022

(54) SI-BASED CTE-MATCHED SUBSTRATE FOR LASER DIODE PACKAGING

(71) Applicant: Lawrence Livermore National Security, LLC, Livermore, CA (US)

(72) Inventors: Susant Patra, Brentwood, CA (US); Robert J. Deri, Pleasanton, CA (US); John W. Elmer, Danville, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 55 days.

(21) Appl. No.: 15/080,514

(22) Filed: Mar. 24, 2016

(65) Prior Publication Data

US 2020/0412083 A1 Dec. 31, 2020

Related U.S. Application Data

(60) Provisional application No. 62/137,368, filed on Mar. 24, 2015.

(51) Int. Cl.
| | |
|---|---|
| *H01S 5/024* | (2006.01) |
| *H01S 5/02* | (2006.01) |
| *H01S 5/323* | (2006.01) |
| *H01L 23/522* | (2006.01) |
| *H01L 23/532* | (2006.01) |
| *H01S 5/40* | (2006.01) |

(52) U.S. Cl.
CPC ...... *H01S 5/02469* (2013.01); *H01L 23/5226* (2013.01); *H01L 23/53228* (2013.01); *H01S 5/021* (2013.01); *H01S 5/024* (2013.01); *H01S 5/0206* (2013.01); *H01S 5/32316* (2013.01); *H01S 5/02423* (2013.01); *H01S 5/4025* (2013.01)

(58) Field of Classification Search
CPC ........... H01L 23/5226; H01L 23/53228; H01S 5/021; H01S 5/02236; H01S 5/02469
See application file for complete search history.

(56) References Cited

U.S. PATENT DOCUMENTS

| | | | | |
|---|---|---|---|---|
| 4,943,468 | A * | 7/1990 | Gordon | H05K 1/0306 174/258 |
| 6,084,895 | A * | 7/2000 | Kouchi | H01S 5/023 372/36 |
| 2002/0038866 | A1* | 4/2002 | Nakatsu | H01L 33/06 257/13 |
| 2009/0052490 | A1* | 2/2009 | Maeda | H01S 5/0217 372/50.11 |
| 2010/0309940 | A1* | 12/2010 | Lee | H01S 5/02469 372/34 |
| 2011/0198646 | A1* | 8/2011 | Wu | H01L 33/641 257/98 |

* cited by examiner

*Primary Examiner* — Michael Carter
(74) *Attorney, Agent, or Firm* — James S. Tak

(57) ABSTRACT

A Cu—Si—Cu substrate having a silicon substrate, copper plating on opposite sides of the silicon substrate, and copper vias extending thru the silicon substrate to electrically and thermally connect the copper platings together. The thicknesses of the silicon substrate and the copper platings are selected so that a coefficient of thermal expansion (CTE) of the Cu—Si—Cu substrate is substantially the same as a CTE of a material to be mounted on the Cu—Si—Cu substrate.

5 Claims, 6 Drawing Sheets

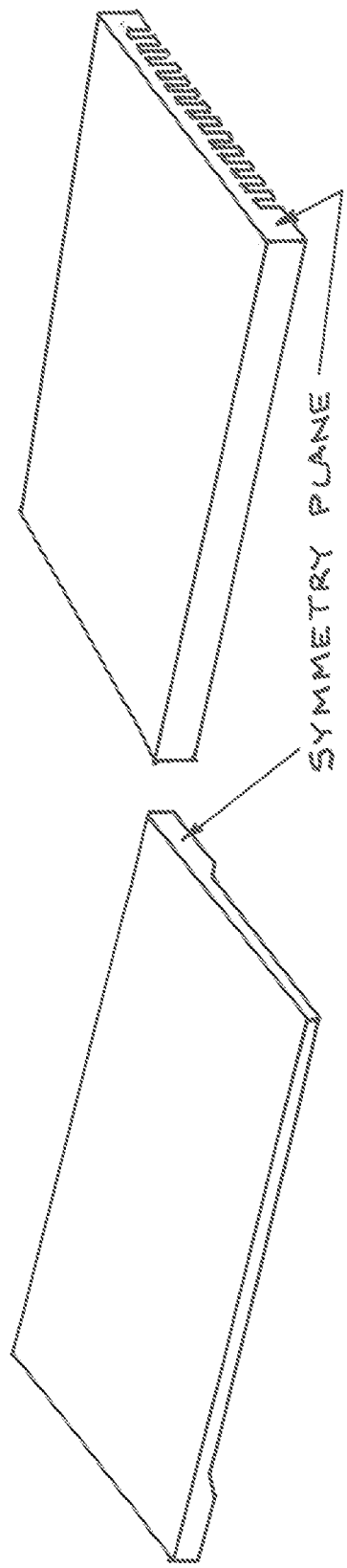
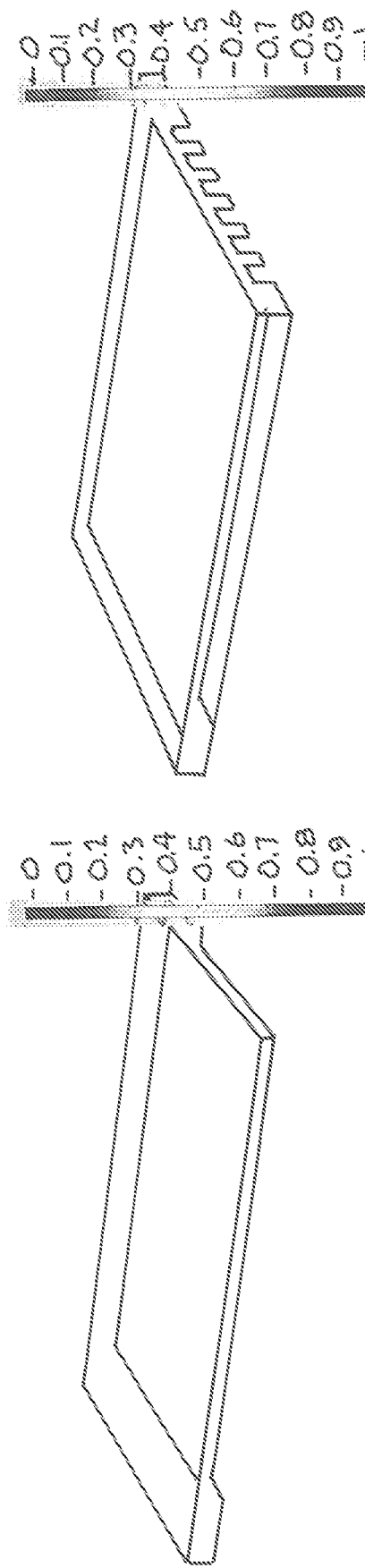
FIG. 3
FIG. 4

SI-BASED CTE-MATCHED SUBSTRATE FOR LASER DIODE PACKAGING

CROSS-REFERENCE TO RELATED APPLICATIONS

This application claims the benefit of U.S. provisional application No. 62/137,368 filed Mar. 24, 2015, which is incorporated by reference herein.

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

BACKGROUND

The present invention generally relates to laser diode packages, and more particularly to a Cu—Si—Cu substrate and a laser diode package using the Cu—Si—Cu substrate which matches the coefficient of thermal expansion (CTE) of a GaAs laser diode to reduce stress between the laser diode and the substrate without compromising diode efficiency due to excess electrical resistance.

Semiconductor laser diodes and high power electronic devices must be mounted to substrates with low strain in order to achieve high device reliability. These submounts typically must be CTE-matched to the semiconductor chip to achieve low strain, and also must provide good thermal conductivity and good electrical conductivity.

High power laser diode chips are often packaged in "stacks", which comprise multiple diode chips separated by substrates. Accurate control of the chip-to-chip separation or pitch is typically necessary so that the optical collimation of all chips in a stack can be performed with a single microlens array. Failure to control the pitch to tight tolerances (micron scale) results in the need for attaching individual microlenses to the stack (one microlens per chip), which can significantly increase manufacturing costs.

For GaAs-based semiconductor devices (e.g. laser diodes, mobile phone power amps, etc.), CuW pseudoalloys, beryllium oxide ceramics, and Cu—Mo—Cu laminated composites are often used for the CTE-matched substrates. However, these materials are relatively expensive to produce. For example, CuW is known to be difficult to machine due to its high tungsten content. And Cu—Mo—Cu multilayers cannot be made thinner than ~0.5 mm, which prevents high density packaging of multiple semiconductor chips. In addition, these materials generally cannot be used to make submounts with tightly-controlled (micron scale) thickness, which adds significant cost to the manufacturing of collimated laser diode stacks. Because of these limitations, these submounts are difficult to incorporate in high volume/low cost, wafer level/batch process packaging.

What is needed therefore is a CTE-matched substrate for low cost laser diode packaging that reduces stress between laser diodes and substrates during the die attach process without compromising diode efficiency due to excess electrical resistance, and enables low cost mounting of semiconductor die using conventional semiconductor processing technology.

SUMMARY

In one example embodiment, the present invention includes a Cu—Si—Cu substrate comprising: a silicon substrate; copper plating on opposite sides of the silicon substrate; and copper vias extending thru the silicon substrate to electrically and thermally connect the copper platings together, wherein thicknesses of the silicon substrate and the copper platings are selected so that a coefficient of thermal expansion (CTE) of the Cu—Si—Cu substrate is substantially the same as a CTE of a material to be mounted on the Cu—Si—Cu substrate.

In another example embodiment, the present invention includes the Cu—Si—Cu substrate as described above, wherein a ratio of total thickness of both copper platings to the thickness of the silicon substrate is about 0.5 so that the CTE of the Cu—Si—Cu substrate is substantially the same as the CTE of a GaAs semiconductor device.

In another example embodiment, the present invention includes the Cu—Si—Cu substrate as described above, wherein the silicon substrate has a cavity on an opposite side of the material to be mounted, said cavity being plated with the copper plating.

In another example embodiment, the present invention includes the Cu—Si—Cu substrate as described above, wherein a silicon substrate has corrugations on an opposite side of the material to be mounted, said corrugations being plated with the copper plating.

In another example embodiment, the present invention includes a laser diode packaging comprising: a silicon substrate; copper plating on opposite sides of the silicon substrate; copper vias extending thru the silicon substrate to electrically and thermally connect the copper platings together; and a laser diode mounted on the copper plating, wherein thicknesses of the silicon substrate and the copper platings are selected so that a coefficient of thermal expansion (CTE) of the Cu—Si—Cu substrate is substantially the same as a CTE of the laser diode.

These and other implementations and various features and operations are described in greater detail in the drawings, the description and the claims.

Generally, the present invention is directed to a low cost, CTE-matched Cu/Si/Cu composite layer substrate, and Cu/Si/Cu composite layer substrate-based laser diode packaging, that reduces stress between laser diodes and substrates during the semiconductor die attach process without compromising thermal or electrical performance. To enhance electrical performance, the Cu/Si/Cu composite layer substrate incorporates copper through-silicon vias (TSV's) into the submount structure so as to provide sufficiently low electrical resistance, and is designed to handle high current and provide thermal path needed for 3D stacking of high power laser diode.

These structures provide the ability to perform packaging at the wafer-level using batch processing, and with additional silicon micromachining can provide tight pitch control in stack assemblies. The flexibility in creating 3D structure in silicon is also used to control stacking pitch of a 3D laser diode array stacking. As this process is compatible with conventional semiconductor process flow, it can be introduced at the downstream of laser diode process to allow testing of diode in an as-packaged condition to identify known good die. One of the advantages of the present invention is that it enables low cost manufacture of expansion-matched substrates using standard semiconductor processing technology, without the need for exotic materials that are expensive to produce and difficult to shape and finish. The approach can be applied for a wide range of substrate thicknesses.

And the approach provides thermal performance similar to today's industry standard (90/10 tungsten/copper pseudoalloy). It also enhances thermal conductivity (with some added cost) when isotopically pure silicon is used in the assembly, and enables accurate pitch control for stacking multiple semiconductor chips in a single assembly, which facilitates the alignment of external microoptics with lower manufacturing costs. And it enables batch packaging of laser diodes using a wafer-level process, which can both improve reduce manufacturing costs and increase manufacturing yields.

It is appreciated that while examples are described about mounting laser diode devices to substrates/submounts, but the same approach may be applied to other high-power semiconductor devices, such as GaAs-based power amplifier chips for cell phones, and possibly high power electronic devices for electric vehicles and other applications in electrical power generation and switching.

BRIEF DESCRIPTION OF THE DRAWINGS

The accompanying drawings, which are incorporated into and forma a part of the disclosure, are as follows:

FIG. 3 show two example embodiments, where larger substrate thicknesses are required or desired, one having a bottom cavity, and the other having corrugations.

FIG. 4 are two graphs illustrating the expansion ration between GaAs and Cu/Si/Cu substrate.

DETAILED DESCRIPTION

Figure 5:
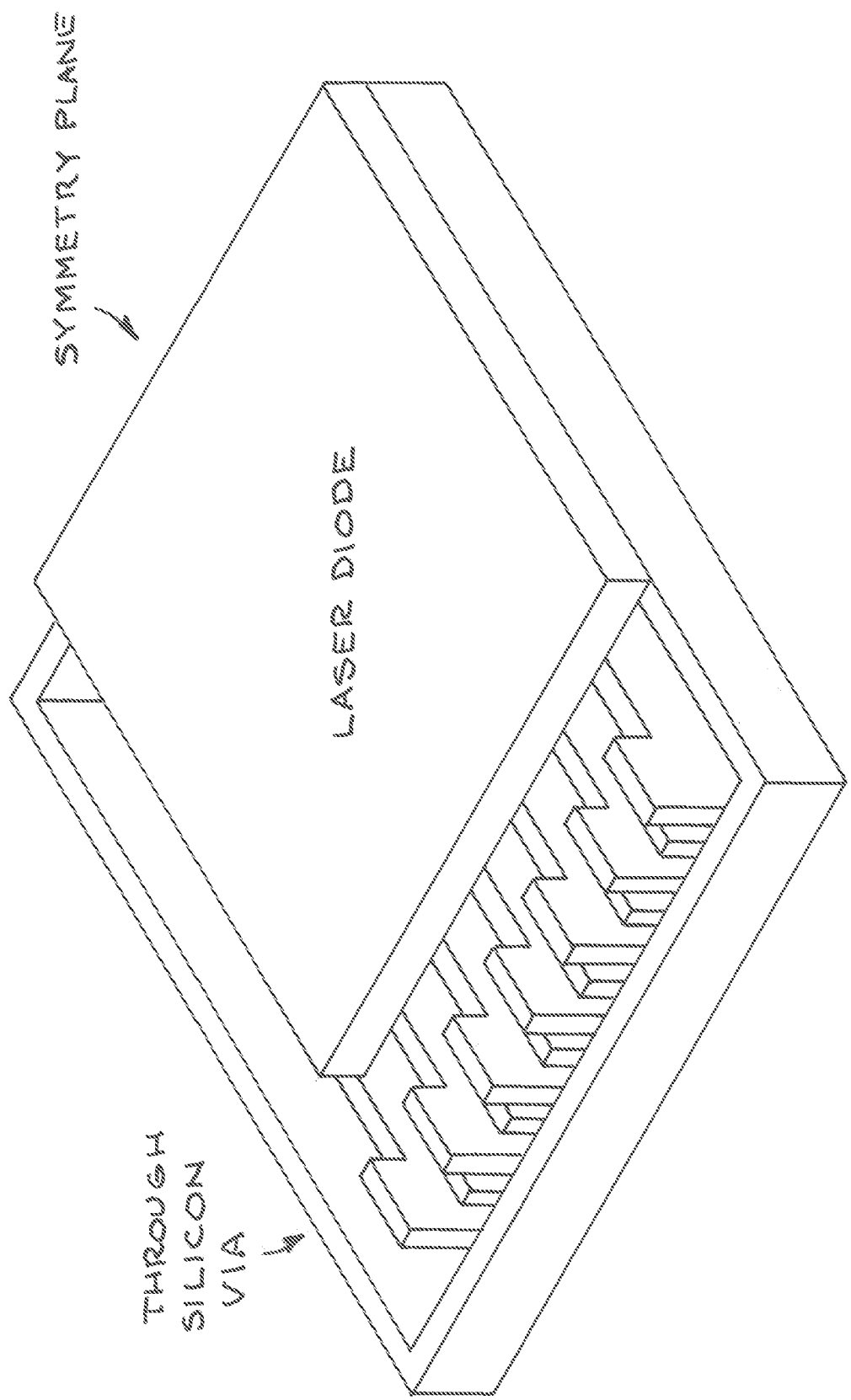
FIG. 5 is an example embodiment of the Cu/Si/Cu substrate with copper vias of the present invention, as well as a laser diode package combining a laser diode with the Cu/Si/Cu substrate.

Turning now to the drawings, FIG. 5 shows an example embodiment of a laser diode package 10 having a Cu—Si—Cu substrate 12 with copper through silicon vias (TSVs) connecting copper platings 13 on opposite sides of the substrate. And a laser diode 14 (e.g. GaAs laser diode) is shown mounted on the copper plating on one side of the substrate. The TSVs act both as electrical and thermal path. It also provides a path for high current through the substrate needed in stacking configuration. The copper vias can be designed with large enough cross sectional area to ensure that the electromigration limit is not reached during high current applications. Due to CTE mismatch between silicon and copper, the copper plug (generated in through silicon via process) tends to expand beyond the silicon plane and creates a local point of contact between substrate and die. This is called pistoning effect. These vias can remain outside the area occupied by GaAs die to eliminate pistoning effect.

Figure 1:
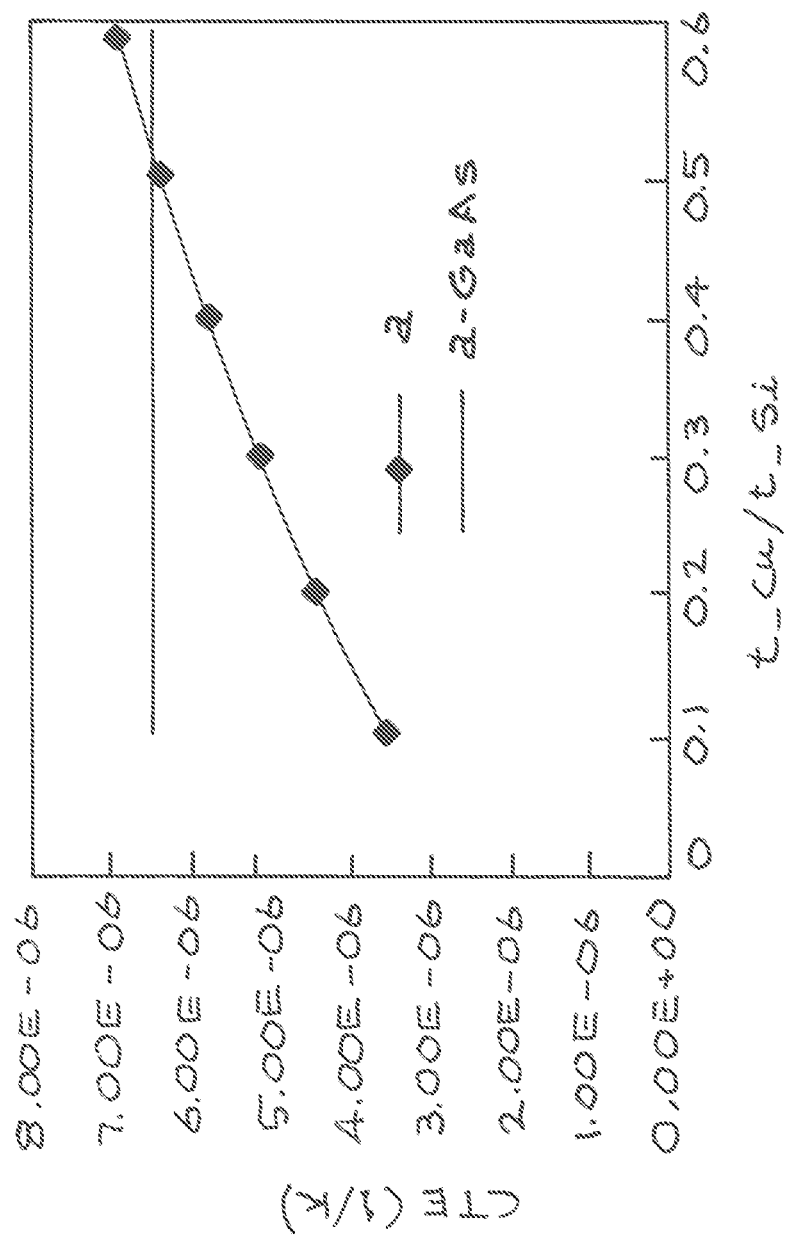
FIG. 1 is a graph showing the CTE of Cu/Si/Cu vs copper/silicon thickness ratio.
Figure 2:
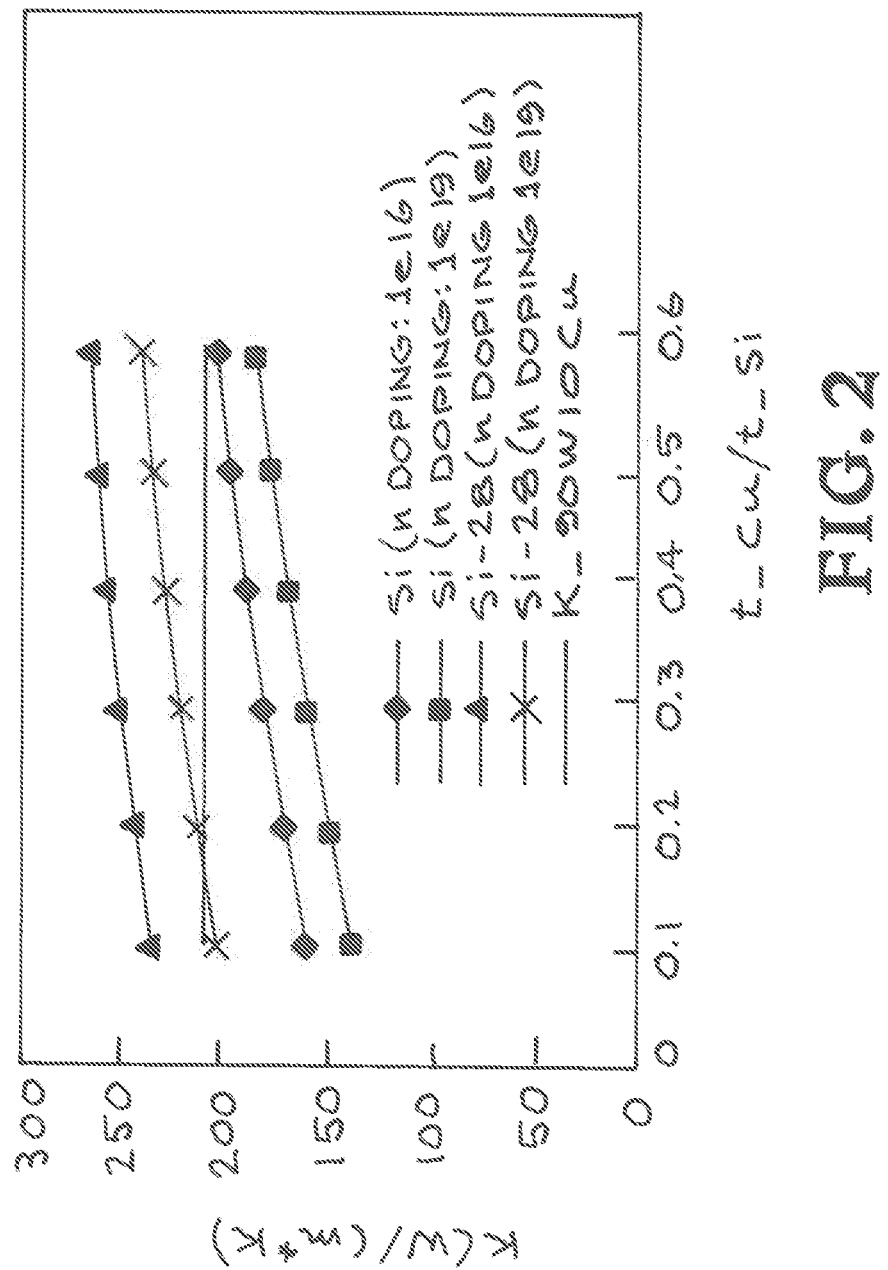
FIG. 2 is a graph showing thermal conductivity of Cu/Si/Cu vs copper/silicon thickness ration.

FIG. 1 shows the effect of the CTE of a Cu/Si/Cu composite on the Cu/Si thickness ratio. Note that a Cu/Si ratio of approximately 0.5 matches that of a GaAs laser diode substrate. And FIG. 2 shows the effect of the Cu/Si thickness ratio on thermal conductivity, which is another important factor in laser diode design. Note that the Cu/Si/Cu composites of the present invention can exceed the thermal conductivity of traditional Cu—W composites under certain conditions. The copper thickness t_cu in this graph represents the total copper thickness (top and bottom layer). In any case, the thicknesses of the silicon substrate and the copper platings are selected so that a coefficient of thermal expansion (CTE) of the Cu—Si—Cu substrate is substantially the same as a CTE of a material to be mounted on the Cu—Si—Cu substrate.

For a typical semiconductor foundry, the typical upper limit on copper plating thickness is 25 um to 30 um. Assuming plating on both sides, the total maximum copper thickness is 50.60 um. Based on FIG. 1, which shows a graph plotting the CTE of Cu/Si/Cu against copper/silicon thickness ratio, the maximum silicon thickness will be approximately 120 um. In 3D stacking of laser diodes, this results in a maximum pitch of 320 um. However, the thin silicon will cause some potential handling issue. If there is a need to go for larger pitch and/or moving to a thicker silicon wafer to minimize yield fallout due to handling related defect, an alternative approach can be adopted as shown in FIG. 3. In particular, in the left image of FIG. 3 one embodiment is shown having a bottom cavity provided (and Cu plated) that thins a center section of the substrate while a perimeter region of the substrate is thicker for handling purposes. In another embodiment shown in FIG. 3, one side of the substrate may have corrugations (which are also Cu plated) in a thicker substrate. In both embodiments shown in FIG. 3, it shows a sectional view taken at the symmetry plane (mid plane). All the above process will allow through silicon via allowing high current needed for high power diode laser application.

CTE matched substrate described above can be used, for example, for two major applications: (a) 3D stacking with accurate pitch control of the stack and (2) move packaging process to laser diode process downstream.

Figure 6:
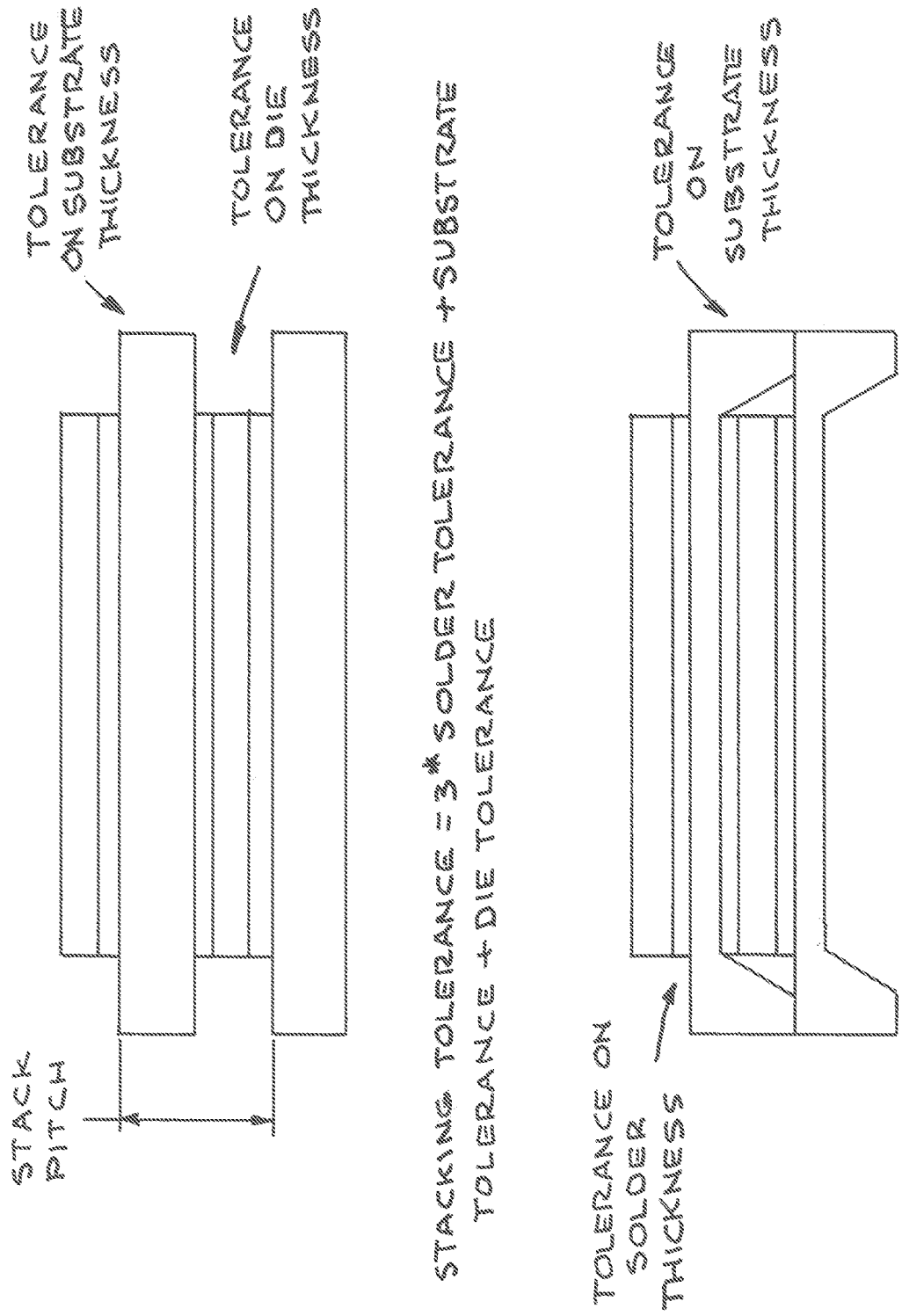
FIG. 6 shows an example embodiment of a stacking arrangement of the present invention based on Cu/Si/Cu substrates with bottom cavities.
Figure 7:
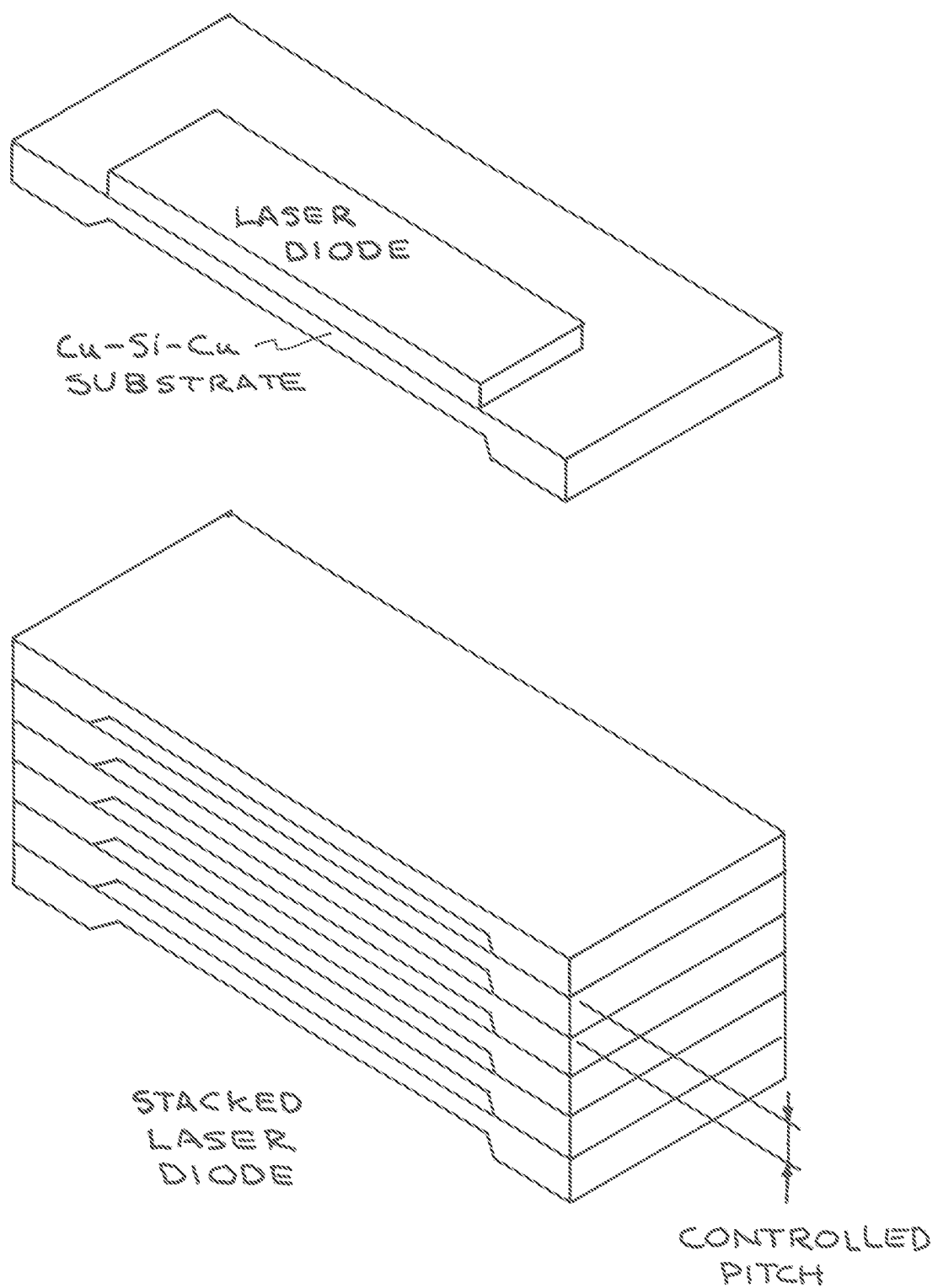
FIG. 7 shows a production step for stacking Cu/Si/Cu substrate with bottom cavities.

Controlled pitch for 3D stacking—The current practice is to use individual fast axis lens with laser diode stack with fine pitch. This is a laborious process. For more efficient lens attach process, a lens array is required. As the pitch of the lens is fixed in the array, for acceptable quality of optical alignment requires that the die to die pitch in a stacked assembly should match that of the lens array. There are three main source of die to die pitch variation: solder thickness, die thickness and substrate thickness. Controlling die thickness is not cost effective and standard metal substrate such as CuW are hard to machine thus making it expensive to control the thickness tolerance. However, in Cu—Si—Cu system, only Si thickness need to be controlled which can be achieved economically and the stacking pitch is defined primarily by silicon thickness as shown FIG. 6. FIG. 7 shows the production sequence, starting with a single Cu/Si/Cu substrate with copper vias, and stacking additional substrates so that the laser diode fits in the cavity of the next substrate being placed.

Incorporating substrate in Die process downstream—In the conventional packaging process, the laser diode is tested in bare die form and deemed known good die provided it satisfies the defined functional requirement. However, the functional characteristics of the die is known to change due to interfacial stress generated during subsequent die attach process in packaging process flow. In conventional packaging process, the known good laser diode is attached to a substrate before going through functional characterization and reliability testing. Even in a batch process flow such as wafer level packaging, the dies are attached sequentially Thus the packaging costs for high throughput is dominated by die attach cost as well as the associated reliability test. In order to eliminate this cost, we can take advantage of semiconductor process compatibility of Cu—Si—Cu substrate.

For batch processing, p-side of GaAs wafer may be attached to the Cu—Si—Cu wafer using a hard solder such as 80Au20Sn. The wafer stress will be low due to CTE match between the GaAs wafer and Cu—S—Cu substrate. It can be reduced further by incorporating transient liquid phase (TLP) solder attach process. Then as the next step, the substrate is diced till GaAs wafer is exposed. Then the GaAs wafer can go through standard cleaving process before facet passivation. The test can be done in batch as shown before further cleaving/dicing to singulate the die with attached substrate. The test of this die will reflect the actual die performance under packaging condition and screened more accurately on basis of its functional characteristics.

Although the description above contains many details and specifics, these should not be construed as limiting the scope of the invention but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

We claim:

1. A Cu—Si—Cu substrate for packaging a GaAs wafer, comprising:
   a silicon substrate;
   copper plating on opposite sides of the silicon substrate; and
   copper vias extending thru the silicon substrate to electrically and thermally connect the copper platings together,
   wherein a ratio of total thickness of both copper platings to the thickness of the silicon substrate is about 0.5 so that a coefficient of thermal expansion (CTE) of the Cu—Si—Cu substrate is substantially the same as a CTE of the GaAs wafer to be mounted on the Cu—Si—Cu substrate.

2. The Cu—Si—Cu substrate of claim 1,
   wherein the silicon substrate has a cavity on an opposite side of the GaAs wafer to be mounted, said cavity being plated with the copper plating and configured to receive therein a second GaAs wafer mounted on a second Cu—Si—Cu substrate when the Cu—Si—Cu substrates are stacked together.

3. The Cu—Si—Cu substrate of claim 1,
   wherein the silicon substrate has corrugations on an opposite side of the GaAs wafer to be mounted, said corrugations being plated with the copper plating and configured to receive therein GaAs wafers mounted on a second Cu—Si—Cu substrate when the Cu—Si—Cu substrates are stacked together.

4. A laser diode packaging comprising:
   a Cu—Si—Cu substrate comprising:
      a silicon substrate;
      copper plating on opposite sides of the silicon substrate; and
      copper vias extending thru the silicon substrate to electrically and thermally connect the copper platings together; and
   GaAs Wafer having a p-side mounted on the copper plating,
   and
   wherein a ratio of total thickness of both copper platings to the thickness of the silicon substrate is about 0.5 so that a coefficient of thermal expansion (CTE) of the Cu—Si—Cu substrate is substantially the same as a CTE of the GaAs wafer.

5. The laser diode packaging of claim 4,
   wherein the silicon substrate has a cavity on an opposite side of the GaAs wafer, said cavity being plated with the copper plating and configured to receive therein a second GaAs wafer mounted on a second Cu—Si—Cu substrate when the Cu—Si—Cu substrates are stacked together.

* * * * *